United States Patent
Park (10) Patent No.: US 6,954,399 B2
(45) Date of Patent: Oct. 11, 2005

(54) COLUMN REPAIR CIRCUIT (75) Inventor: Jong Hun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 104 days.

(21) Appl. No.: 10/737,961

(22) Filed: Dec. 18, 2003

(65) Prior Publication Data

US 2004/0208069 A1 Oct. 21, 2004

(30) Foreign Application Priority Data

Apr. 17, 2003 (KR) .................. 10-2003-0024417

(51) Int. Cl.⁷ .................................. G11C 8/00
(52) U.S. Cl. ................. 365/230.06; 365/225.7; 365/200
(58) Field of Search .............. 365/230.06, 225.7, 365/200

(56) References Cited

U.S. PATENT DOCUMENTS 6,301,164 B1 * 10/2001 Manning et al. ......... 365/225.7
6,343,037 B1 * 1/2002 Park et al. ............. 365/230.06
6,597,608 B2 * 7/2003 Kang et al. ................. 365/200
6,657,907 B2 * 12/2003 Lee .......................... 365/225.7

FOREIGN PATENT DOCUMENTS

JP  2003-016795  1/2003
KR  2002-0000694  1/2002

* cited by examiner

*Primary Examiner*—Anh Phung
*Assistant Examiner*—Tuan T. Nguyen
(74) *Attorney, Agent, or Firm*—Heller Ehrman LLP (57) ABSTRACT

A column repair circuit of a semiconductor memory device including a plurality of memory cell array blocks each having the different number of wordlines comprises a predecoder, a block selector, a unit selector and a fuse means. The predecoder decodes a row address. The block selector generates block selecting signals to select the memory cell array blocks. The unit selector generates unit selecting signals to select a size of a row corresponding to the selected memory cell array. The fuse means generates a column repair control signal activated when a column repair is performed on the selected memory cell array block. The column repair circuit performs a column repair operation by a memory cell array block unit, thereby improving column repair efficiency and reducing the number of column repair fuses.

16 Claims, 12 Drawing Sheets

COLUMN REPAIR CIRCUIT

BACKGROUND OF THE INVENTION

1. Field of the Invention

The present invention generally relates to a column repair circuit for repairing a failed cell, and more specifically, to a column repair circuit for performing a column repair operation on memory cell array blocks each having the different number of wordlines.

2. Description of the Prior Art

Generally, in a semiconductor memory device, defective cells are replaced with redundancy memory cells.

When at least one of normal memory cells connected to a column selecting line is defective, a column repair circuit replaces the column selecting line with a redundancy column selecting line. That is, memory cells connected to column selecting lines connected to at least one defective memory cell are replaced with redundancy memory cells connected redundancy column selecting lines.

Figure 1:
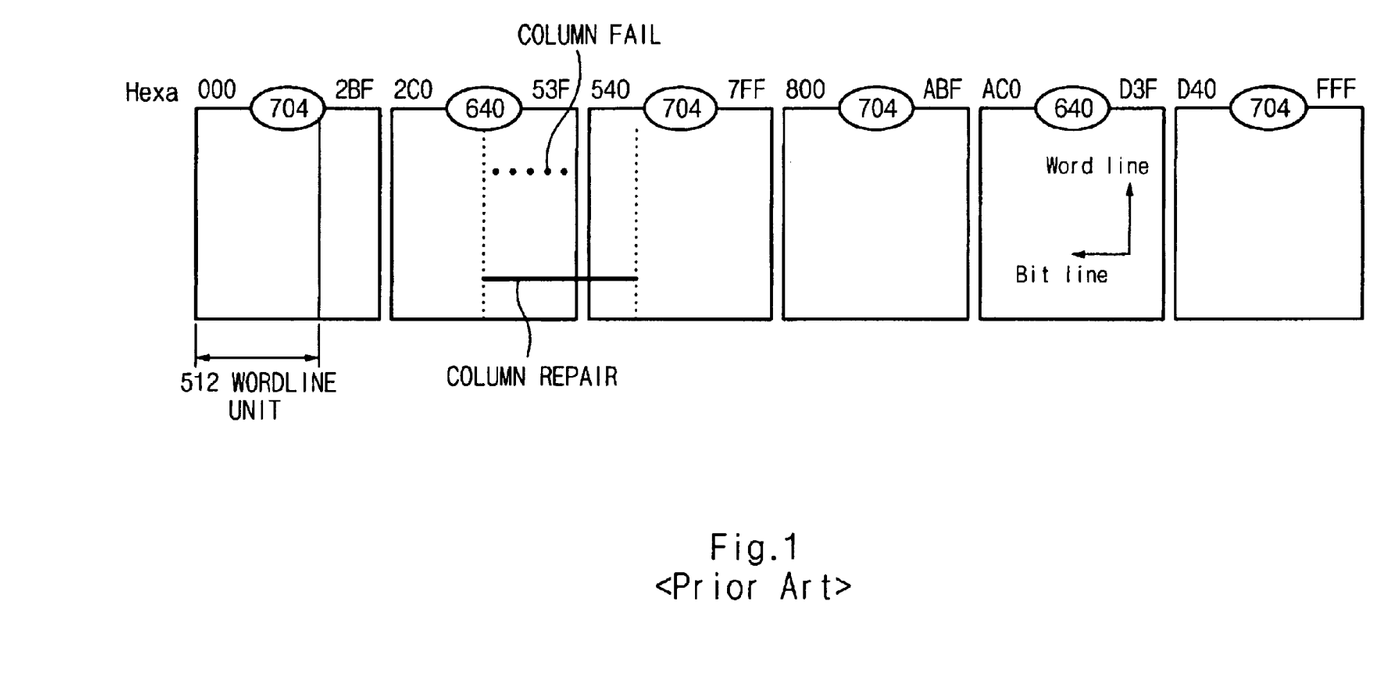
FIG. 1 is a diagram illustrating a structure of a memory including memory cell array blocks each having the different number of wordlines.

FIG. 1 is a diagram illustrating a structure of a memory including memory cell array blocks each having the different number of wordlines. Here, 128M memory cell array block is exemplified.

Generally, a DRAM that has a 128M memory cell array block structure is configured to have four 32M banks.

Each 32M bank comprises two groups, and each group comprises 6 memory cell array blocks.

Here, 6 memory cell array blocks included in one group are shown.

In order to increase cell density by reducing the number of bitline sense amplifiers arranged between memory cell array blocks, one memory cell array block is arranged to have 704 or 640 wordlines.

A DRAM comprises a column repair circuit for repairing the failed when a column failure occurs in a memory cell array block,.

However, although one memory cell array block is arranged to have 704 or 640 wordlines, the column repair operation is performed by 512 wordlines.

Figure 2A:
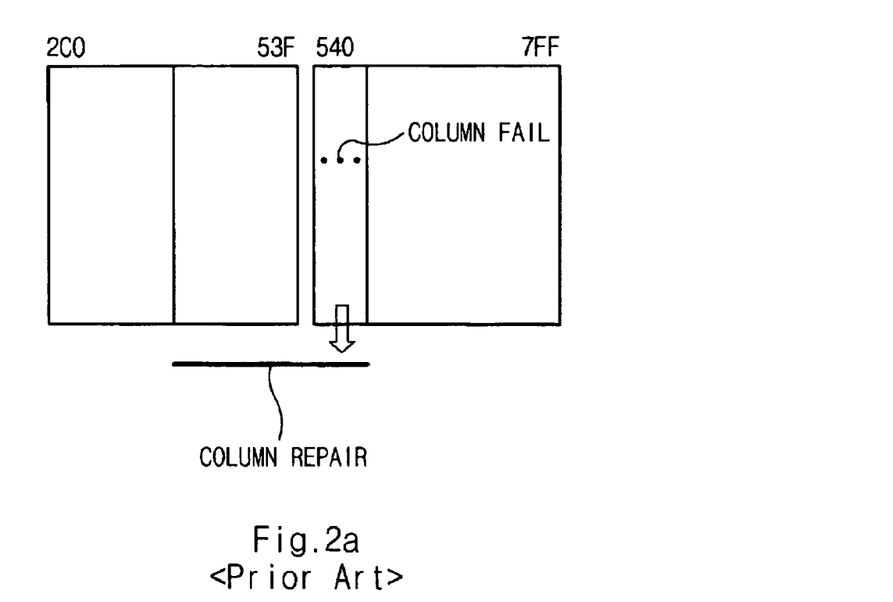
FIG. 2a is a diagram illustrating a column repair operation when a column failure occurs in the memory of FIG. 1.
Figure 2B:
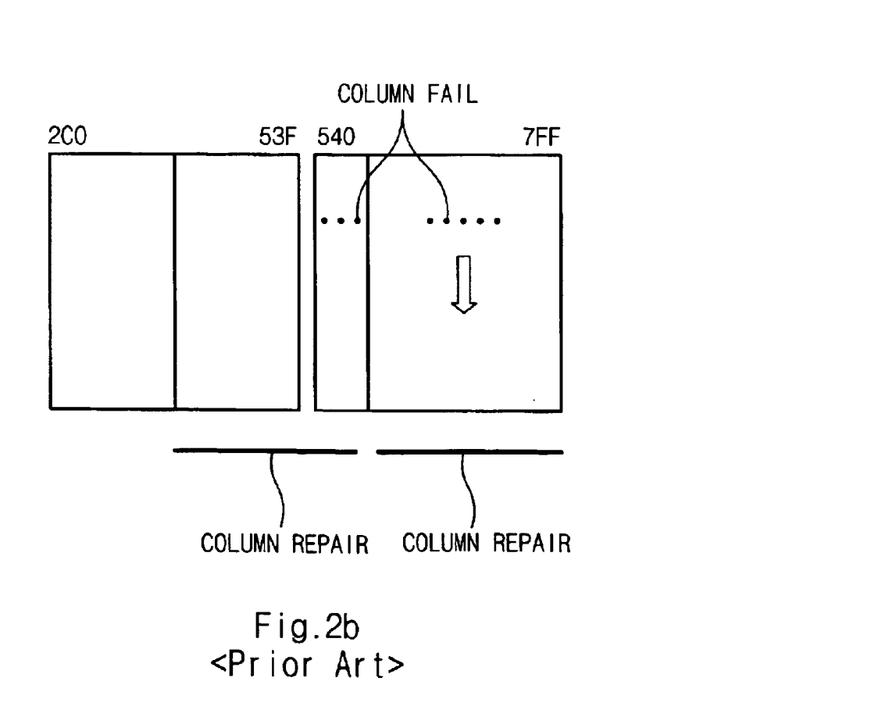

As shown in FIG. 2a, when a column failure occurs in a second block in the memory cell array block of FIG. 1, the column repair operation is performed only on the third block. Thereafter, as shown in FIG. 2b, when a burn-in test, a reliability test and an application test performed on the rest 512 wordlines and a column failure happens, an additional column repair line is required for the column failure of the same block, which results in degradation of repair efficiency.

SUMMARY OF THE INVENTION

Accordingly, it is an object of the present invention to perform a repair operation on each memory cell array block, thereby improving the repair efficiency.

It is another object of the present invention to perform a repair operation on each memory cell array block, thereby reducing the number of column repair fuses.

In an embodiment, a column repair circuit of a semiconductor memory device including a plurality of memory cell array blocks each having the different number of rows comprises a predecoder, a block selector, a unit selector and a fuse means. The predecoder decodes a row address. The block selector generates block selecting signals to select the memory cell array blocks in response to output signals from the predecoder. The unit selector generates unit selecting signals to select a size of a row corresponding to the selected memory cell array in response to a refresh mode signal, a row repair control signal, a row repair identifying signal, a row active signal and the block selecting signals. The fuse means generates a column repair control signal activated in response to a column repair test signal and the unit selecting signals when a column repair is performed on the selected memory cell array block.

BRIEF DESCRIPTION OF THE DRAWINGS

FIG. 2b is a diagram illustrating a column repair operation when a column failure occurs in a test after the column repair operation of FIG. 2a.

DETAILED DESCRIPTION OF THE PREFERRED EMBODIMENTS

The present invention will be described in detail with reference to the accompanying drawings.

Figure 3:
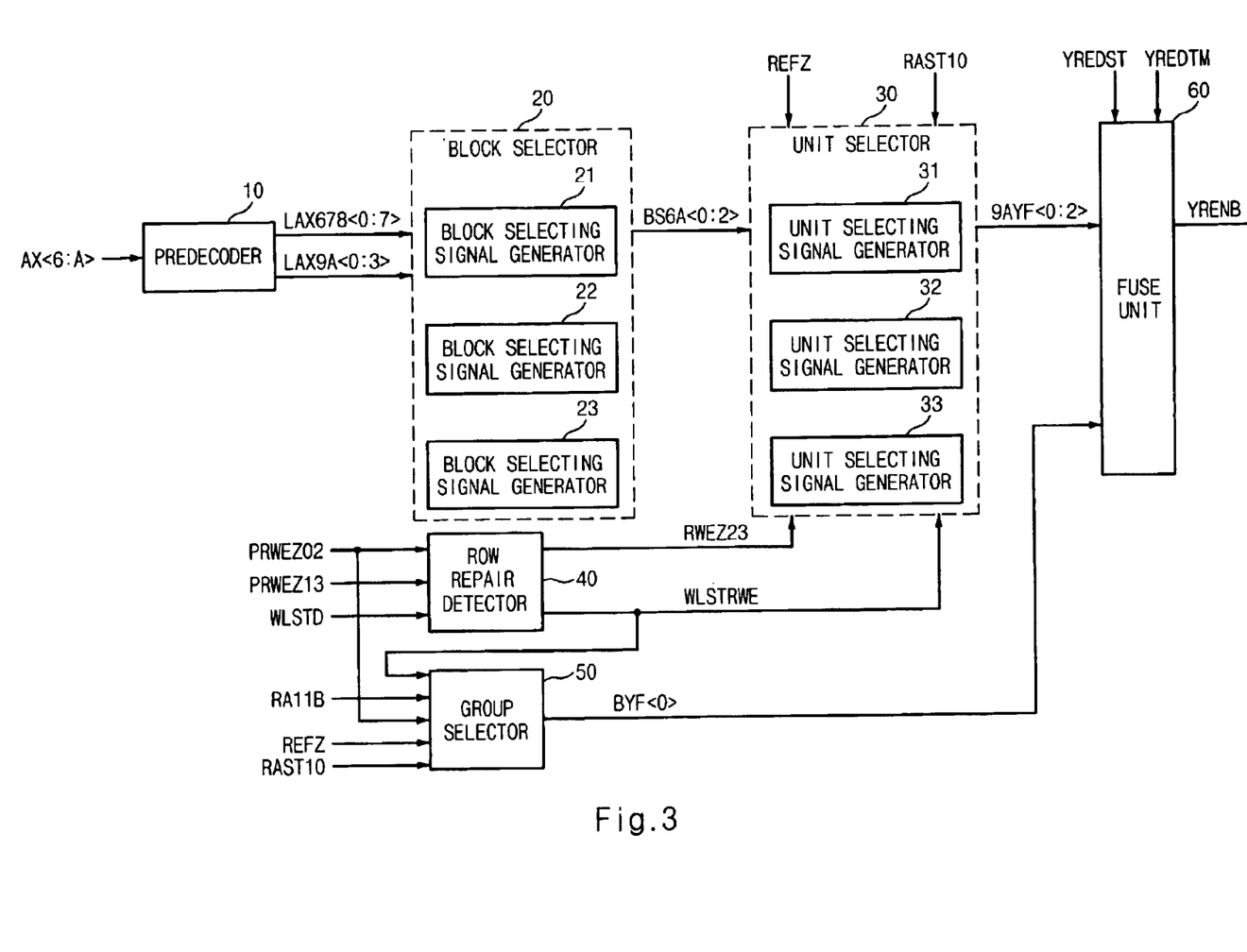
FIG. 3 is a block diagram of a column repair circuit according to an embodiment of the present invention.

FIG. 3 is a block diagram of a column repair circuit according to an embodiment of the present invention. Here, a DRAM having a 128M memory cell array block structure is exemplified.

In the DRAM having 128M memory cell array block structure, the whole memory cell is configured to be quartered. That is, the memory cell comprises four 32M banks.

Each 32M bank comprises 2 groups, and each group comprises 6 memory cell array blocks.

Here, a column repair circuit on 3 memory cell array blocks in one group including 6 memory cell array blocks is shown because a column repair circuit on the rest 3 memory cell array blocks has the same structure.

3 memory cell array blocks are configured to have 704, 640 and 704 wordlines, respectively. In the configuration of row addresses, the upper 6 bit row addresses AX<0:5> is to select wordlines, and the rest bit row address AX<6:B> is to select memory cell array blocks.

In an embodiment, the column repair circuit comprises a predecoder 10, a block selector 20, a unit selector 30, a row repair detector 40, a group selector 50 and a fuse unit 60.

The predecoder 10 decodes row addresses AX<6:A>.

The block selector 20 outputs a block selecting signal BS6A<0:2> for selecting a memory cell array block in response to output signals LAX678<0:7> and LAX9A<0:2> from the predecoder 10.

The unit selector 30 outputs a unit selecting signal 9AYF<0:2> to determine whether a repair operation is performed on column lines of the selected memory cell array block to have 704 or 640 wordlines in response to a row repair identifying signal WLSTRWE, a row repair control signal RWEZ23, a refresh mode signal REFZ, a first row active signal RAST10 and a block selecting signal BS6A<0:2>. Here, the row repair identifying signal WLSTRWE becomes at a high level when the block has a row repair line. The row repair control signal RWEZ23 becomes at a high level when the row is repaired. The refresh mode signal REFZ becomes at a low level in a refresh mode. The first row active signal RAST10 becomes at a high level when the row is active.

The row repair detector 40 outputs the row repair control signal RWEZ23 and the row repair identifying signal WLSTRWE in response to a first row repair selecting signal PRWEZ02, a second row repair selecting signal PRWEZ13 and a second row active signal WLSTD. Here, the first row repair selecting signal PRWEZ02 becomes at a low level when a row repair of a second memory cell array block is selected. The second row repair selecting signal PRWEZ13 becomes at a low level when a row repair of a fifth memory cell array block is selected. The second row active signal WLSTD is delayed for a delay time until a row repair flag signal is generated through a row fuse box.

The group selector 50 outputs a group selecting signal BYF<0> in response to a group selecting address RA11B, a refresh mode signal REFZ, a first row active signal RAST10 and the row repair identifying signal WLSTRWE.

The fuse unit 60 outputs a column repair control signal YRENB for controlling a column corresponding to a fuse of a memory cell array block to be repaired in response to a precharge signal YREDST, a column repair test signal YREDTM, the first row repair selecting signal PRWEZ02, a unit selecting signal 9AYF<0:2> and the group selecting signal BYF<0>. Here, the precharge signal YREDST becomes at a low level in a standby state, and the column repair test signal YREDTM becomes at a high level when a column repair is tested.

Figure 4A:
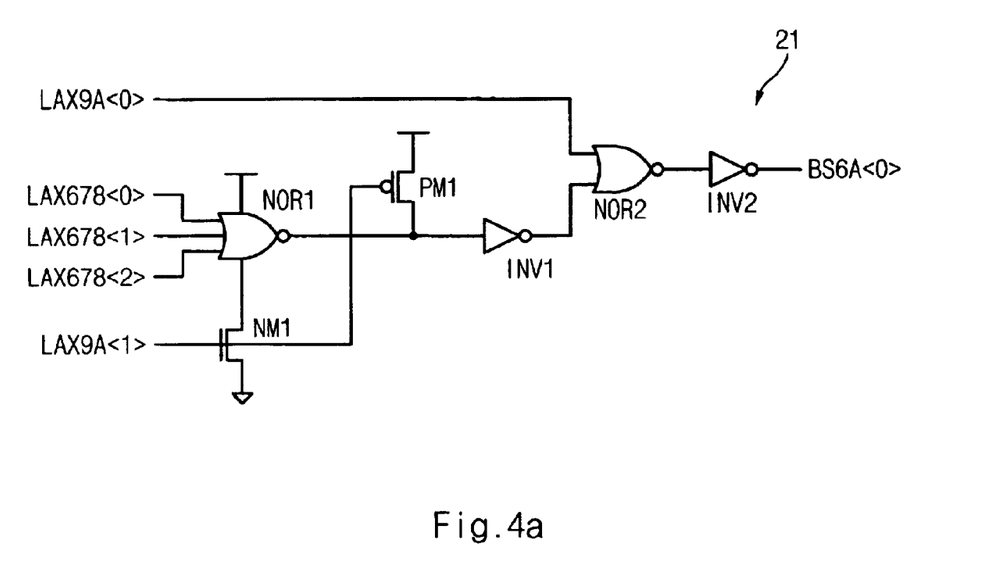
FIGS. 4a to 4c are circuit diagram of a block selector of FIG. 3.
Figure 4B:
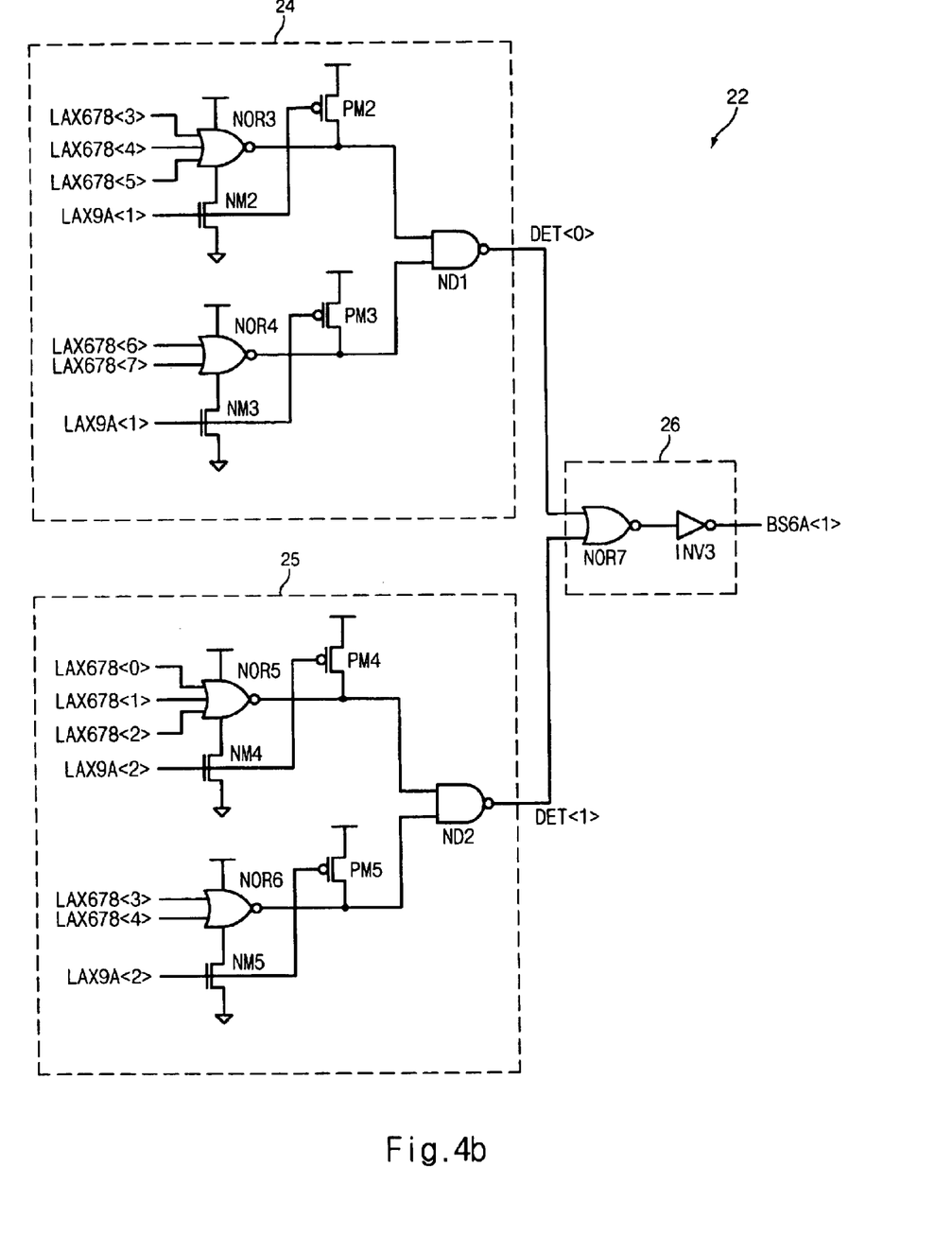
Figure 4C:
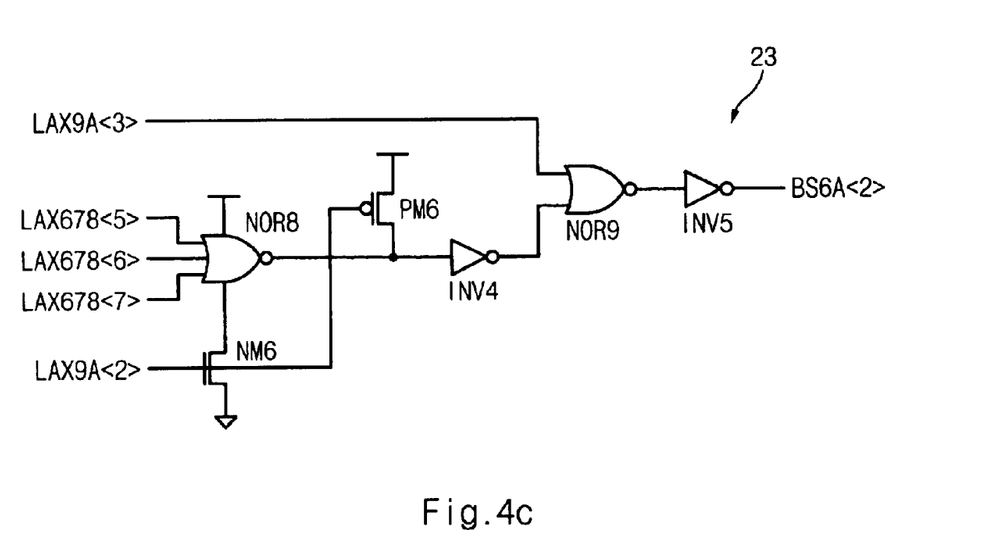

FIGS. 4a to 4c are circuit diagram of the block selector 20 of FIG. 3. Here, the block selector 20 comprises block selecting signal generators 21, 22 and 23 for generating block selecting signals BS6A<0:2> to select a corresponding memory cell array block.

FIG. 4a is a circuit diagram of the block selecting signal generator 21 for generating a first block selecting signal to select a first memory cell array block.

The first block selecting signal generator 21 comprises NOR gates NOR1 and NOR2, a NMOS transistor NM1, a PMOS transistor PM1 and inverters INV1 and INV2. The NOR gate NOR1 performs an NOR operation on output signals LAX678<0:2> from the predecoder 10. The NMOS transistor NM1 has a gate to receive an output signal LAX9A<1> from the predecoder 10, thereby activating the NOR gate NOR1. The PMOS transistor PM1 has a gate to receive the output signal LAX9A<1> from the predecoder 10, thereby initializing an output terminal of the NOR gate NOR1 to a high level. The inverter INV1 inverts an output signal from the NOR gate NOR1. The NOR gate NOR2 performs an NOR operation on the output signal LAX9A<0> from the predecoder 10 and an output signal from the inverter INV1. The inverter INV2 inverts an output signal from the NOR gate NOR2 to output the first block selecting signal BS6A<0>.

If the first row repair unit selecting signal LAX9A<0> is at a high level or one of the output signals LAX678<0:2> from the predecoder 10 is at a high level and the second row repair unit selecting signal LAX9A<1> is at a high level, the first block selecting signal BS6A<0> to select a first memory cell array block becomes at a high level to activate the first memory cell array. Here, the first row repair unit selecting signal LAX9A<0> becomes at a high level when a first unit having 512 row wordlines is selected. The second row repair unit selecting signal LAX9A<1> becomes at a high level when a second unit having 512 row wordlines is selected.

Meanwhile, if the second row repair unit selecting signal LAX9A<1> is at a low level, the PMOS transistor PM1 is turned on to set an output terminal of the NOR gate NOR1 as a high level regardless of the output signals LAX678<0:2> from the predecoder 10. AS a result, the state of the first block selecting signal BS6A<0> is determined by that of the first row repair unit selecting signal LAX9A<0>.

FIG. 4b is a circuit diagram of the block selecting signal generator 22 for generating a second block selecting signal to select a second memory cell array block.

The second block selecting signal generator 22 comprises an upper detector 24, a lower detector 25 and a logic combination unit 26. The upper detector 24 detects when an upper portion of the memory cell array block is selected. The lower detector 25 detects when a lower portion of the memory cell array block is selected. The logic combination unit 26 performs a logic operation on output signals from the upper detector 24 and the lower detector 25 to output the second block selecting signal BS6A<1>.

The upper detector 24 comprises NOR gates NOR3 and NOR4, NMOS transistors NM2 and NM3, PMOS transistors PM2 and PM3 and an NAND gate ND1. The NOR gate NOR3 performs an NOR operation on output signals LAX678<3:5>. The NMOS transistor NM2 has a gate to receive the output signal LAX9A<1> from the predecoder 10, thereby activating the NOR gate NOR3. The PMOS transistor PM2 has a gate to receive the output signal LAX9A<1> from the predecoder 10, thereby initializing an output terminal of the NOR gate NOR3 to a high level. The NOR gate NOR4 performs an NOR operation on output signals LAX678<3:4> from the predecoder 10. The NMOS transistor NM3 has a gate to receive the output signal LAX9A<1> from the predecoder 10, thereby activating the NOR gate NOR4. The PMOS transistor PM3 has a gate to receive the output signal LAX9A<1> from the predecoder 10, thereby initializing an output terminal of the NOR gate NOR4 to a high level. The NAND gate ND1 performs an NAND operation on output signals from the NOR gates NOR3 and NOR4.

The lower detector 25 comprises NOR gates NOR5 and NOR6, NMOS transistors NM4 and NM5, PMOS transistors PM4 and PM5 and an NAND gate ND2. The NOR gate NOR5 performs an NOR operation on output signals LAX678<3:5> from the predecoder 10. The NMOS transistor NM4 has a gate to receive an output signal LAX9A<2>, thereby activating the NOR gate NOR5. The PMOS transistor PM4 has a gate to receive the output signal LAX9A<2> from the predecoder 10, thereby initializing an output terminal of the NOR gate NOR5 to a high level. The NOR gate NOR6 performs an NOR operation on output signals LAX678<6:7> from the predecoder 10. The NMOS transistor NM5 has a gate to receive the output signal LAX9A<2> from the predecoder 10, thereby activating the NOR gate NOR6. The PMOS transistor PM5 has a gate to receive the output signal LAX9A<2> from the predecoder 10, thereby initializing an output terminal of the NOR gate NOR6 to a high level. The NAND gate ND2 performs an NAND operation on output signals from the NOR gates NOR5 and NOR6.

The logic combination unit 26 comprises an NOR gate NOR7 and an inverter INV3. The NOR gate NOR7 performs an NOR operation on output signals DET<0:1> from the upper detector 24 and the lower detector 25. The inverter INV3 inverts an output signal from the NOR gate NOR7.

The upper detector 24 outputs a high level signal DET<0> if the second row repair unit selecting signal LAX9A<1> is at a high level and one of the output signals LAX678<3:7> from the predecoder 10 is at a high level.

If the second row repair unit selecting signal LAX9A<1> is at a low level, the PMOS transistors PM2 and PM3 are turned on to set output terminals of the NOR gate NOR3 and NOR4 as a high level regardless of the output signals LAX678<3:7> from the predecoder 10. As a result, the output signal DET<0> from the NAND gate ND1 becomes at a low level.

The lower detector 25 outputs a high level signal DET<1> if a third row repair unit selecting signal LAX9A<2> is at a high level and one of the output signals LAX678<0:4> from the predecoder 10 is at a high level. Here, the third row repair unit selecting signal LAX9A<2> becomes at a high level when a third unit having 512 wordlines is selected.

If the third row repair unit selecting signal LAX9A<2> is at a low level, the PMOS transistors PM4 and PM5 are turned on to set output terminals of the NOR gates NOR5 and NOR6 as a high level regardless of the output signals LAX678<0:4> from the predecoder 10. As a result, the output signal DET<1> from the NAND gate ND2 becomes at a low level.

If one of the output signals DET<0:1> from the upper detector 24 and the lower detector 25 becomes at a high level, the second block selecting signal BS6A<1> outputted from the logic combination unit 26 becomes at a high level to activate the second memory cell array block.

If the output signals DET<0:1> from the upper detector 24 and the lower detector 25 become all at a low level, the second block selecting signal BS6A<1> outputted from the logic combination unit 26 becomes at a low level to inactivate the second memory cell array block.

FIG. 4c is a circuit diagram of the block selecting signal generator 23 for generating a third block selecting signal to select a third memory cell array block.

The third block selecting signal generator 23 comprises NOR gates NOR8 and NOR9, an NMOS transistor NM6, a PMOS transistor PM6 and inverters INV4 and INV5. The NOR gate NOR8 performs an NOR operation on output signals LAX678<5:7> from the predecoder 10. The NMOS transistor NM6 has a gate to receive the output signal LAX9A<2>, thereby activating the NOR gate NOR8. The PMOS transistor PM6 has a gate to receive the output signal LAX9A<2> from the predecoder 10, thereby initializing an output terminal of the NOR gate NOR8 to a high level. The inverter INV4 inverts an output signal from the NOR gate NOR8. The NOR gate NOR9 performs an NOR operation on an output signal LAX9A<3> from the predecoder 10 and an output signal from the inverter INV4. The inverter INV5 inverts an output signal from the NOR gate NOR9 to output a block selecting signal BS6A<2>.

If a fourth row repair unit selecting signal LAX9A<3> is at a high level or one of the output signals LAX678<5:7> from the predecoder 10 is at a high level and the signal LAX9A<2> representing the third unit having 512 wordlines is at a high level, the third block selecting signal BS6A<2> becomes at a high level to activate the third memory cell array block. Here, the fourth row repair unit selecting signal LAX9A<3> becomes at a high level when a fourth unit consisting of 512 wordlines is selected.

If the third row repair unit selecting signal LAX9A<2> is at a low level, the PMOS transistor PM6 is turned on to set an output terminal of the NOR gate NOR8 as a high level. As a result, the state of the third block selecting signal BS6A<2> is determined by that of the fourth row repair unit selecting signal LAX9A<3>.

Figure 5A:
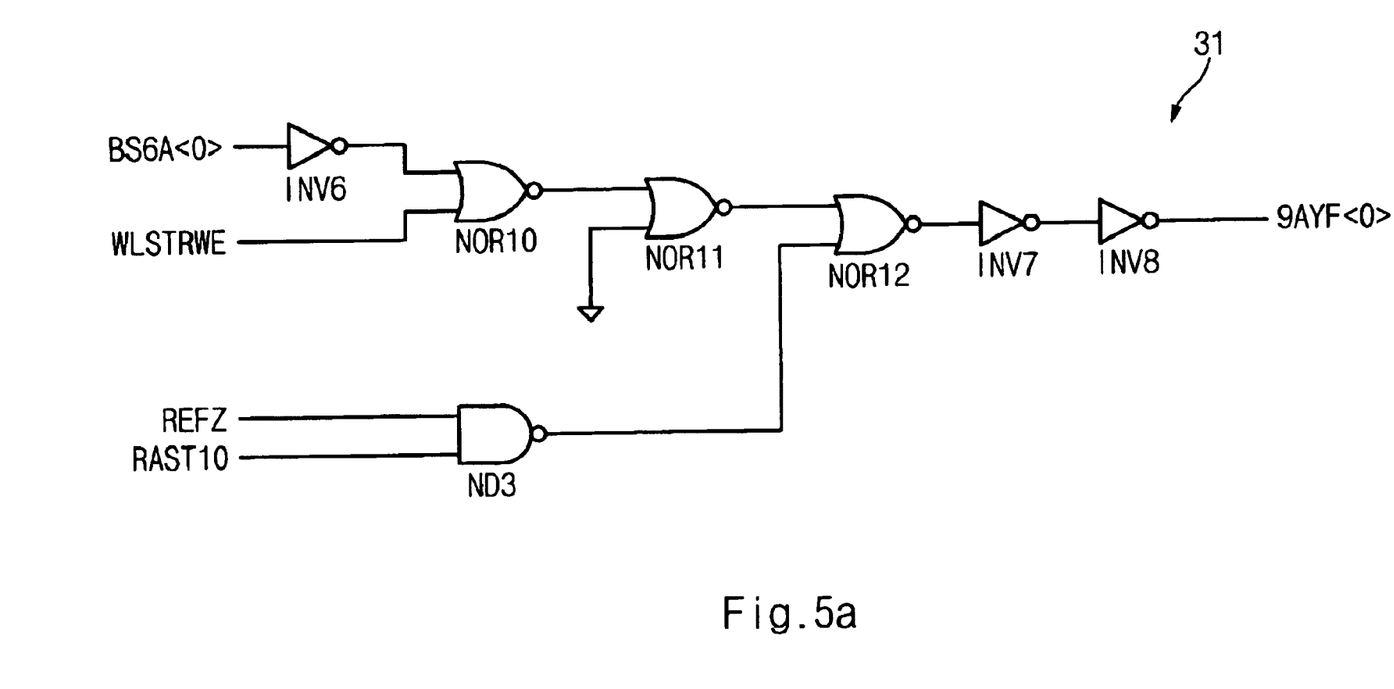
FIGS. 5a to 5c are circuit diagram of a unit selector of FIG. 3.
Figure 5B:
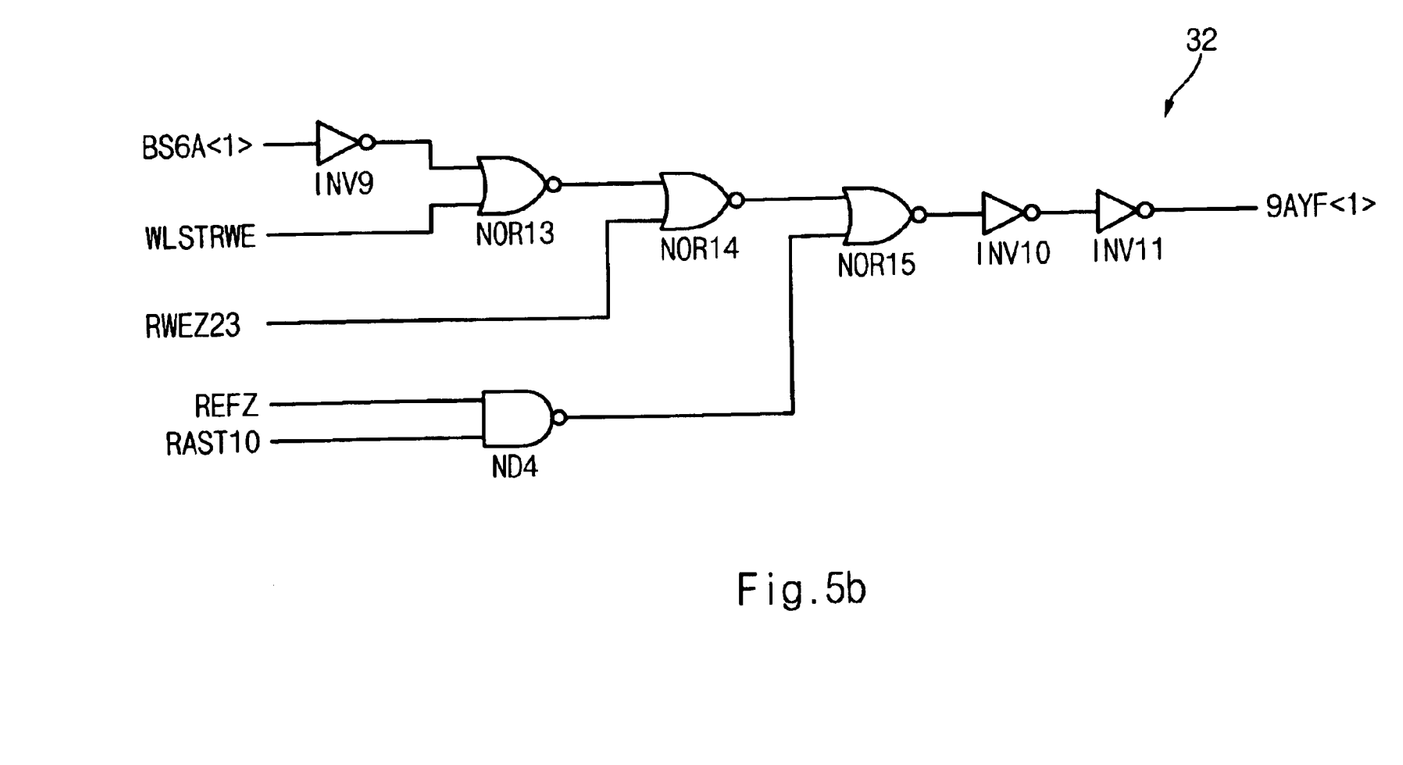
Figure 5C:
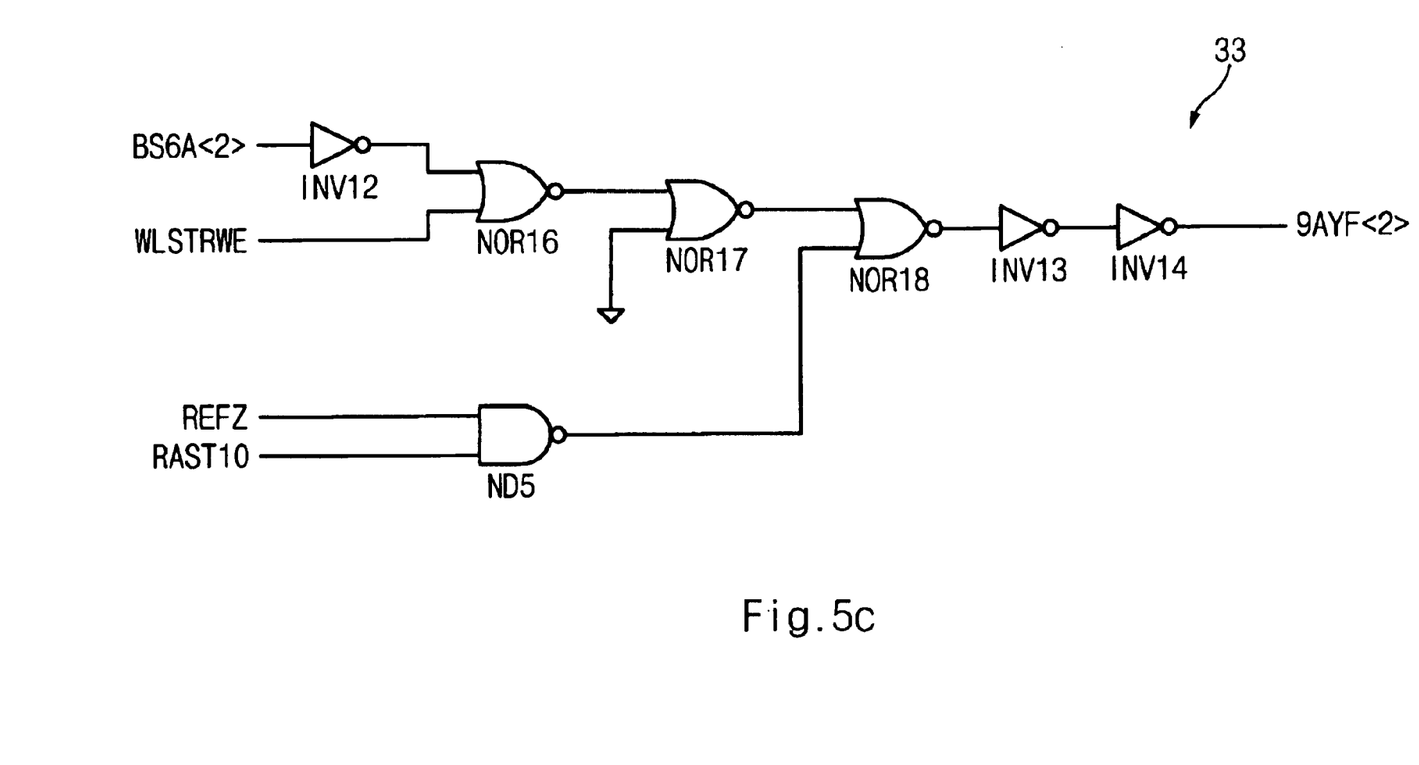

FIGS. 5a to 5c are circuit diagram of the unit selector 30 of FIG. 3. Here, the unit selector 30 comprises unit selecting signal generators 31, 32 and 33 for generating unit selecting signals 9AYF<0:2> to select a corresponding row unit (for example, 704 or 640 wordlines).

FIG. 5a is a circuit diagram of the unit selecting signal generator 31 for generating a first unit selecting signal 9AYF<0> to select a row repair unit of a first memory cell array block of the unit selector 30 of FIG. 3.

The first unit selecting signal generator 31 comprises inverters INV6, INV7 and INV8, NOR gates NOR10, NOR11 and NOR12 and an NAND gate ND3. The inverter INV6 inverts the first block selecting signal BS6A<0>. The NOR gate NOR10 performs an NOR operation on an output signal from the inverter INV6 and the row repair identifying signal WLSTRWE. The NOR gate NOR11 has one input terminal to receive an output signal from the NOR gate NOR10 and the other input terminal connected to a ground voltage. The NAND gate ND3 performs an NAND operation on the refresh mode signal REFZ and the first row active signal RAST10. The NOR gate NOR12 performs an NOR operation on output signals from the NOR gate NOR11 and the NAND gate ND3. The inverters INV7 and INV8 invert output signals from the NOR gate NOR12 sequentially.

FIG. 5b is a circuit diagram of the unit selecting signal generator 32 for generating a second unit selecting signal 9AYF<1> to select a row repair unit of a second memory cell array block of the unit selector 30 of FIG. 3.

The second unit selecting signal generator 32 comprises inverters INV9, INV10 and INV11, NOR gates NOR13, NOR14, NOR15 and an NAND gate ND4. The inverter INV9 inverts the second block selecting signal BS6A<1>. The NOR gate NOR13 performs an NOR operation on an output signal from the inverter INV9 and the row repair identifying signal WLSTRWE. The NOR gate NOR14 performs on the row repair control signal RWEZ23 and an output signal from the NOR gate NOR13. The NAND gate ND4 performs an NAND operation on the refresh mode signal REFZ and the first row active signal RAST10. The NOR gate NOR15 performs an NOR operation on output signals from the NOR gate NOR14 and the NAND gate ND4. The inverters INV10 and INV11 invert output signals from the NOR gate NOR15 sequentially.

FIG. 5c is a circuit diagram of the unit selecting signal generator 33 for generating a third unit selecting signal 9AYF<2> to select a row repair unit of a third memory cell array block of the unit selector 30 of FIG. 3.

The third unit selecting signal generator 33 comprises inverters INV12, INV13 and INV14, NOR gates NOR16, NOR17 and NOR18 and an NAND gate ND5. The inverter INV12 inverts the third block selecting signal BS6A<2>. The NOR gate NOR16 performs an NOR operation on an output signal from the inverter INV12 and the row repair identifying signal WLSTRWE. The NOR gate NOR17 has one input terminal to receive an output signal from the NOR gate NOR16 and the other input terminal connected to a ground voltage. The NAND gate ND5 performs an NAND operation on the refresh mode signal REFZ and the first row active signal RAST10. The NOR gate NOR18 performs an NOR operation on output signals from the NOR gate NOR17 and the NAND gate ND5. The inverters INV13 and INV14 invert output signals from the NOR gate NOR18 sequentially.

Hereinafter, the operation of the unit selector 30 is described.

If the refresh mode signal REFZ is at a low level, that is, in a refresh mode, or if the first row active signal RAST10 is at a low level, a column fuse is not used. As a result, the unit selecting signals 9AYF<0:2> become all at a low level.

If the row repair identifying signal WLSTRWE becomes at a high level, the block selecting signal BS6A<0:2> selected by an external address is ignored. As a result, since the second memory cell array block has a row repair, the first unit selecting signal 9AYF<0> and the third unit selecting signal 9AYF<2> become all at a low level. However, if the row repair control signal RWEZ23 becomes at a high level, the second unit selecting signal 9AYF<1> becomes at a high level.

Figure 6:
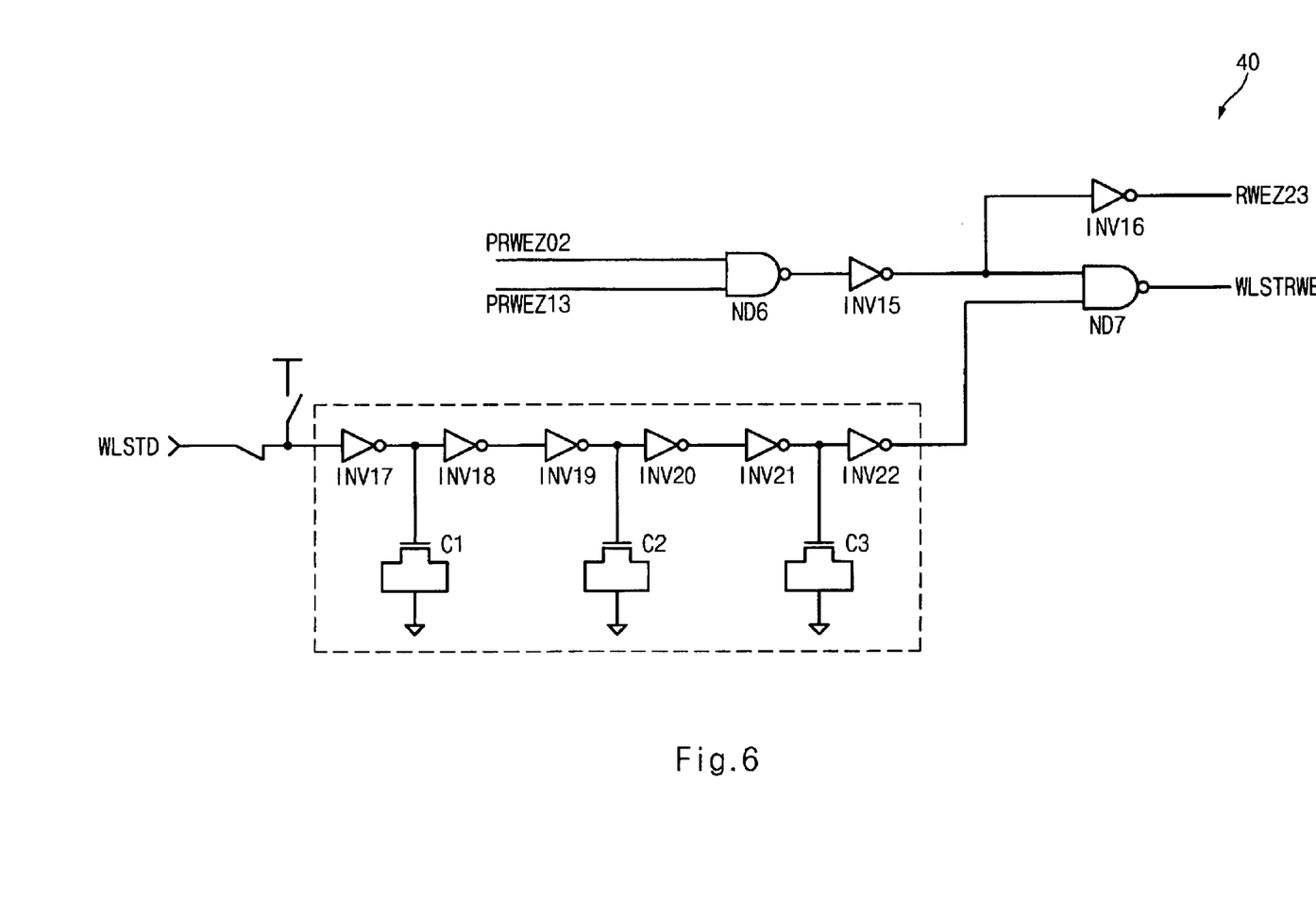
FIG. 6 is a circuit diagram of a repair detector of FIG. 3.

FIG. 6 is a circuit diagram of the repair detector 40 of FIG. 3.

The row repair detector 40 comprises NAND gates ND6 and ND7, inverters INV15 and INV16 and a delay unit 41. The NAND gate ND6 performs an NAND operation on the first row repair selecting signal PRWEZ02 and the second row repair selecting signal PRWEZ13. The inverter INV15 inverts an output signal from the NAND gate ND6. The inverter INV16 inverts an output signal from the inverter INV15 to output the row repair control signal RWEZ23. The delay unit 41 delays the second row active signal WLSTD for a predetermined time. The NAND gate ND7 performs an NAND operation on output signals from the inverter INV15 and the delay unit 41 to output the row repair identifying signal WLSTRWE.

Here, the delay unit 41 comprises inverters INV17~INV22 connected in series, and NMOS-type capacitors C1, C2 and C3 connected to output terminals of the inverters INV17, INV19 and INV21.

Hereinafter, the operation of the row repair detector 40 is described.

If one of the first row repair selecting signal PRWEZ02 and the second row repair selecting signal PRWEZ13 is at a low level, the row repair control signal RWEZ23 becomes at a high level.

If one of the first row repair selecting signal PRWEZ02 and the second row repair selecting signal PRWEZ13 becomes at a low level, the row repair identifying signal WLSTRWE becomes at a high level regardless of the second row active signal WLSTD.

If both of the first row repair selecting signal PRWEZ02 and the second row repair selecting signal PRWEZ13 are at a high level, the state of the row repair identifying signal WLSTRWE is determined by that of the second row active signal WLSTD.

Figure 7:
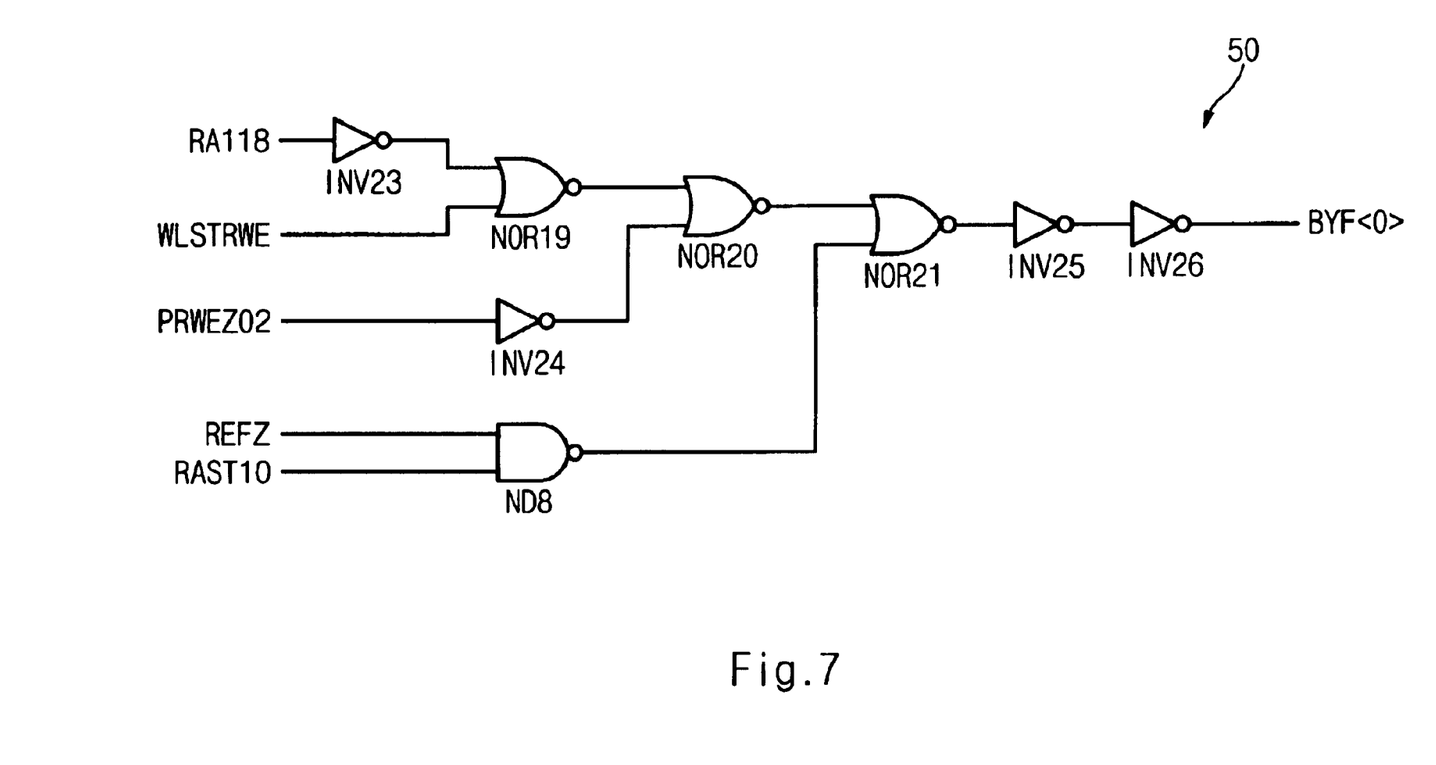
FIG. 7 is a circuit diagram of a group selecting signal generator of FIG. 3.

FIG. 7 is a circuit diagram of the group selecting signal generator 50 of FIG. 3 for generating the first group selecting signal BYF<0> to select three upper memory cell array blocks out of 6 memory cell array blocks.

The group selector 50 comprises inverters INV23~INV26, NOR gates NOR19~NOR21 and an NAND gate ND8. The inverter INV23 inverts a group selecting address RA11B. The NOR gate NOR19 performs an NOR operation on an output signal from the inverter INV23 and the row repair identifying signal WLSTRWE. The inverter INV24 inverts the first row repair selecting signal PRWEZ02. The NOR gate NOR20 performs an NOR operation on output signals from the NOR gate NOR19 and the inverter INV24. The NAND gate ND8 performs an NAND operation on the refresh mode signal REFZ and the first row active signal RAST10. The NOR gate NOR21 performs an NOR operation on output signals from the NOR gate NOR20 and the NAND gate ND8. The inverters INV25 and INV26 invert output signals from the NOR gate NOR21 sequentially to output the group selecting signal BYF<0>. The group selecting address RA11B becomes at a high level when a row address AX<B> for selecting three upper of lower memory cell array block groups out of 6 memory cell array block is at a low level Hereinafter, the operation of the group selector 50 is described.

IF the row repair identifying signal WLSTRWE becomes at a high level and the block selecting address RA11B becomes at a high level, the output signal from the NOR gate NOR19 becomes at a low level.

Here, if the refresh mode signal REFZ becomes at a high level and the first row active signal RAST10 becomes at a high level, the output signal from the NAND gate ND8 becomes at a low level. IF the first row repair selecting signal PRWEZ02 becomes at a low level, the output signal from the NOR gate NOR20 becomes at a low level. Thus, the output signal from the NOR gate NOR21 becomes at a high level.

As a result, the first group selecting signal BYF<0> for selecting 3 upper memory cell array blocks out of 6 memory cell array blocks is activated to a high level.

The other group selector for generating a second group selecting signal BYF<1> to select 3 lower memory cell array blocks out of 6 memory cell array blocks is not explained because the group selector has the same structure as that of the other group selector 50.

Figure 8:
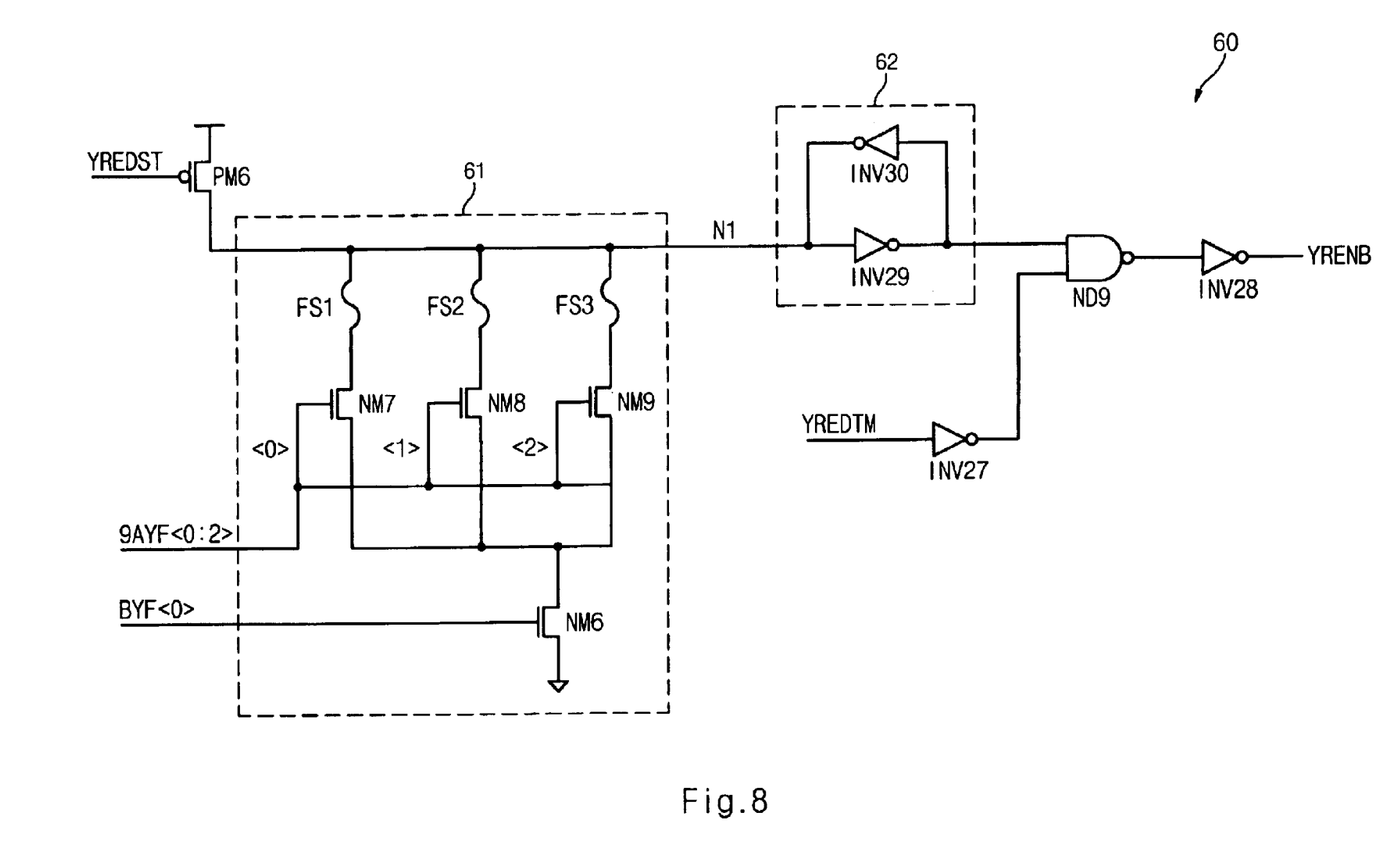
FIG. 8 is a circuit diagram of a fuse unit of FIG. 3.

FIG. 8 is a circuit diagram of the fuse unit 60 of FIG. 3. FIG. 8 shows a fuse unit of 3 upper memory cell array blocks out of 6 memory cell array blocks. In case of 3 lower memory cell array blocks, a fuse unit is configured to have the same structure as that of a fuse block 61 comprising fuses connected to an output terminal of the fuse block 61 so as to be activated by the second group selecting signal BYF<1>.

The fuse unit 60 comprises a fuse block 61, a latch unit 62, an NAND gate ND9 and inverters INV27 and INV28. The fuse block 61, activated by the first group selecting signal BYF<0>, represent a repair operation in response to unit selecting signals 9AYF<0:2>. In a row active state, the PMOS transistor PM6 sets an output terminal N1 of the fuse block 61 to a high level in response to the precharge signal. The latch unit 62 maintains a potential of the output terminal N1 of the fuse block 61. The inverter INV27 inverts the column repair test signal YREDTM. The NAND gate ND9 performs an NAND operation on an output signal from the latch unit 62 and on output signal from the inverter INV27. The inverter INV28 inverts an output signal from the NAND gate ND8 to output the column repair control signal YRENB.

Here, the fuse block 61 comprises fuses FS1, FS2 and FS3, and NMOS transistors NM6~NM9. The fuses FS1, FS2 and FS3 are connected to the output terminal N1 in parallel. The NMOS transistors NM7, NM8 and NM9 have drains connected to the fuses FS1, FS2 and FS3, sources connected in common, and gates to receive the unit selecting signal 9AYF<0:2>, respectively. The NMOS transistor NM6 has a drain connected to the common source of the NMOS transistors NM7, NM8 and NM9, a source connected to a ground voltage, and a gate to receive the first group selecting signal BYF<0>.

The latch unit 62 comprises inverters INV29 and INV30. An input terminal of the inverter INV29 is connected to an output terminal of the inverter INV30 while an input terminal of the inverter 30 is connected to an output terminal of the inverter INV29.

When a column repair of a memory cell array block is used, the column repair control signal YRENB is maintained at the high level. However, when the column repair is not used, the column repair control signal YRENB is discharged to a low level.

In this way, a column repair is used by a unit consisting of 640 or 704 wordlines instead of 512 wordlines, that is, by a memory cell array block unit. In other words, a wordline is used in each memory cell array block. As a result, the number of fuses can be reduced, thereby preventing mis-operation due to use of fuses.

As described above, a column repair circuit according to an embodiment of the present invention prevents a column failure, which results from a repair operation performed only on a partial column in one memory cell array block, because each memory cell array block having the different number of wordlines is repaired by a unit of blocks.

Additionally, since column repair fuses are used by a memory cell array block unit in the column repair circuit, the number of column repair fuses can be reduced, thereby preventing mis-operation due to use of fuses.

What is claimed is:

1. A column repair circuit of a semiconductor memory device including a plurality of memory cell array blocks, wherein a part of the plurality of memory cell array blocks has the different number of wordlines, comprising:
    a predecoder for decoding a row address;
    a block selector for generating block selecting signals to select the memory cell array blocks in response to output signals from the predecoder;
    a unit selector for generating unit selecting signals in response to a refresh mode signal, a row repair control signal, a row repair identifying signal, a row active signal and the block selecting signals; wherein the unit selecting signals select a unit of a wordline corresponding to the selected memory cell array block; and
    a fuse means for generating a column repair control signal in response to a column repair test signal and the unit selecting signals; wherein the column repair control signal is activated when a column repair is performed on the selected memory cell array block.

2. The circuit according to claim 1, wherein the block selector comprises a plurality of block selecting signal generators for generating the block selecting signals in response to the output signals from the predecoder.

3. The circuit according to claim 2, wherein the block selecting signal generator comprises:
    a first logic means for performing a logic operation on the output signals from the predecoder; and
    a second logic means for performing a logic operation on an output signal from the first logic means and a row repair unit signal.

4. The circuit according to claim 3, wherein the block selecting signal generator further comprises an activation means for activating the first logic means depending on the row repair unit signal.

5. The circuit according to claim 4, further comprising precharge means for precharing an output terminal to a predetermined level depending on the row repair unit signal.

6. The circuit according to claim 1, wherein the unit selector comprises a plurality of unit selecting signal generators for generating the unit selecting signals in response to the refresh mode signal, the row repair control signal and the block selecting signals.

7. The circuit according to claim 6, wherein the unit selecting signal generator comprises:
    a third logic means for performing a logic operation on the block selecting signal and the row repair control signal;
    a fourth logic means for performing a logic operation on the refresh mode signal and the row active signal; and
    a fifth logic means for performing a logic operation on output signals from the third logic means and the fourth logic means.

8. The circuit according to claim 6, wherein the unit selecting signal generator comprises:
    a sixth logic means for performing a logic operation on the block selecting signal and the row repair control signal;
    a seventh logic means for performing a logic operation on an output signal from the sixth logic means and the row repair identifying signal;
    an eighth logic means for performing a logic operation on the refresh mode signal and the row active signal; and
    a ninth logic means for performing a logic operation on output signals from the seventh logic means and the eighth logic means.

9. The circuit according to claim 1, further comprising a repair detector for generating the row repair control signal and the row repair identifying signal in response to row repair selecting signals,
    wherein the row repair selecting signal selects the row repair line of the memory cell array blocks having row repair lines.

10. The circuit according to claim 9, wherein the row repair detector comprises:
    a tenth logic means for performing a logic operation on the row repair selecting signals to output the row repair control signal;
    a delay means for delaying a signal for a predetermined time, the signal obtained by delaying the row active signal for a predetermined time; and
    an eleventh logic means for performing a logic operation on output signals from the tenth logic means and the delay means to output the row repair identifying signal.

11. The circuit according to claim 1, further comprising a group selector for generating the group selecting signal in response to a block selecting address, the row repair identifying signal, the row repair control signal, the refresh mode signal and the row active signal wherein the group selecting signal selects a group including a predetermined number of the memory cell array blocks.

12. The circuit according to claim 11, wherein the group selector comprises a plurality of group selecting signal generators to generate the group selecting signals.

13. The circuit according to claim 12, wherein the group selecting signal generator comprises:
    a twelfth logic means for performing a logic operation on the block selecting address and the row repair identifying signal;
    a thirteenth logic operation for performing a logic operation on an output signal from the twelfth logic means and the row repair control signal;
    a fourteenth logic operation for performing a logic operation on the refresh mode signal and the row active signal; and
    a fifteenth logic operation for performing a logic operation on output signals from the thirteenth logic means and the fourteenth logic means.

14. The circuit according to claim 1, wherein the fuse means comprises:

a plurality of fuse blocks including a plurality of fuses; and an output means for outputting a potential of a common node of the plurality of fuse blocks synchronously with respect to a column repair test signal.

15. The circuit according to claim 14, wherein the fuse block further comprises a plurality of detector to identify whether each fuse is cut in response to the unit selecting signals.

16. The circuit according to claim 14, further comprising a latch means for maintaining a potential of a common node of the plurality of fuse blocks.

* * * * *